(12) United States Patent
Carson et al.

(10) Patent No.: US 8,877,866 B2
(45) Date of Patent: Nov. 4, 2014

(54) CURABLE EPOXY RESIN COMPOSITIONS HAVING IMPROVED ADHESION TO METAL SUBSTRATES AND PROCESSES FOR MAKING AND USING THE SAME

(75) Inventors: Terri J. Carson, Greensboro, NC (US); Ludovic Valette, Shanghai (CN)

(73) Assignee: Dow Global Technologies LLC, Midland, MI (US)

( * ) Notice: Subject to any disclaimer, the term of this patent is extended or adjusted under 35 U.S.C. 154(b) by 931 days.

(21) Appl. No.: 12/445,823

(22) PCT Filed: Oct. 10, 2007

(86) PCT No.: PCT/US2007/021672
§ 371 (c)(1),
(2), (4) Date: Oct. 28, 2009

(87) PCT Pub. No.: WO2008/051373
PCT Pub. Date: May 2, 2008

(65) Prior Publication Data
US 2010/0068958 A1    Mar. 18, 2010

Related U.S. Application Data

(60) Provisional application No. 60/852,788, filed on Oct. 19, 2006.

(51) Int. Cl.
| | | |
|---|---|---|
| B05D 3/02 | (2006.01) | |
| B29C 65/02 | (2006.01) | |
| B32B 17/02 | (2006.01) | |
| B32B 37/10 | (2006.01) | |
| C08L 33/02 | (2006.01) | |
| C08L 61/10 | (2006.01) | |
| C08L 63/04 | (2006.01) | |
| C08L 63/00 | (2006.01) | |
| C08G 59/42 | (2006.01) | |
| C08G 59/62 | (2006.01) | |
| C08L 53/02 | (2006.01) | |
| H05K 1/03 | (2006.01) | |

(52) U.S. Cl.
CPC ............ *C08L 63/00* (2013.01); *C08G 59/42* (2013.01); *C08G 59/621* (2013.01); *C08L 53/02* (2013.01); *H05K 1/0326* (2013.01)
USPC ...... 525/92 H; 156/308.2; 442/173; 427/366; 428/365

(58) Field of Classification Search
USPC ............ 442/59, 232; 525/88; 427/386; 156/308.2
See application file for complete search history.

(56) References Cited

U.S. PATENT DOCUMENTS

| | | | |
|---|---|---|---|
| 5,910,521 A * | 6/1999 | Johnson et al. ............ 523/145 | |
| 6,894,113 B2 | 5/2005 | Court et al. | |
| 7,579,392 B2 | 8/2009 | Gan et al. | |
| 2003/0187154 A1 | 10/2003 | Schoenfeld et al. | |
| 2004/0034124 A1 | 2/2004 | Court et al. | |
| 2004/0101689 A1 | 5/2004 | Valette | |
| 2004/0247881 A1 * | 12/2004 | Dean et al. ............... 428/413 |
| 2007/0078236 A1 * | 4/2007 | Bonnet et al. ............. 525/529 |
| 2009/0008826 A1 * | 1/2009 | Court et al. ............ 264/331.13 |
| 2009/0159313 A1 * | 6/2009 | Valette et al. ............ 174/250 |
| 2009/0321117 A1 * | 12/2009 | Valette et al. ............ 174/258 |

FOREIGN PATENT DOCUMENTS

| | | |
|---|---|---|
| CN | 1115772 A | 1/1996 |
| EP | 1290088 A1 | 3/2003 |
| FR | 2841252 A1 | 12/2003 |
| WO | WO-00/27921 A1 | 5/2000 |
| WO | WO-00/76764 A1 | 12/2000 |
| WO | WO-2005/014699 A1 | 2/2005 |
| WO | WO 2005/014699 A1 * | 2/2005 |
| WO | WO-2007/009957 A1 | 1/2007 |
| WO | WO-2007/064801 A1 | 6/2007 |

OTHER PUBLICATIONS

*Epoxy resins: chemistry and technology*, second edition, Mercel Dekker, Inc., 1988, pp. 506-512.
"Flame retardants-101 Basic Dynamics-Past efforts create future opportunities", Fire Retardants Chemicals Association, Baltimore, Marriot Inner Harbour Hotel, Baltimore, Maryland, U.S.A., Mar. 24-27, 1996, sections 0005-0011.
*Handbook of Epoxy Resins* by H.E. Lee and K. Neville, McGraw-Hill, New York, 1967, chapter 2-3.
Macromolecules 2002, 6245.
Macromolecules 2003, 118.
Macromolecules 2004, 37, 8017-8027.
Macromol. Symp. 2003, 198, 309-322.
Polymer 2000, 41, 6375-6386.

* cited by examiner

*Primary Examiner* — Robert Sellers

(57) ABSTRACT

Thermosettable compositions are described having improved adhesion to metal substrates when cured comprising (a) at least one curable epoxy resin; (b) at least one hardener, each hardener having less than 1 primary amine group per molecule and not more than 1 secondary amine group per molecule, the hardener(s) comprising at least one polyhydroxy hydrocarbon, hydrocarbon capable of generating multiple hydroxy groups per molecule during curing of the thermosettable material, or poly(acid anhydride)hydrocarbon other than a blend of (1) a copolymer of an ethylenically unsaturated anhydride and a vinyl compound and (2) a copolymer of an ethylenically unsaturated anhydride and an elastomer, and (c) at least one triblock copolymer comprising at least one elastomeric block and at least one acrylic block. Processes for making a coated article, a fiber-reinforced composite article, prepregs and laminates using the thermosettable compositions are also described, which are useful for making coated articles, fiber-reinforced composites, prepregs, laminates and printed wiring boards.

17 Claims, 1 Drawing Sheet

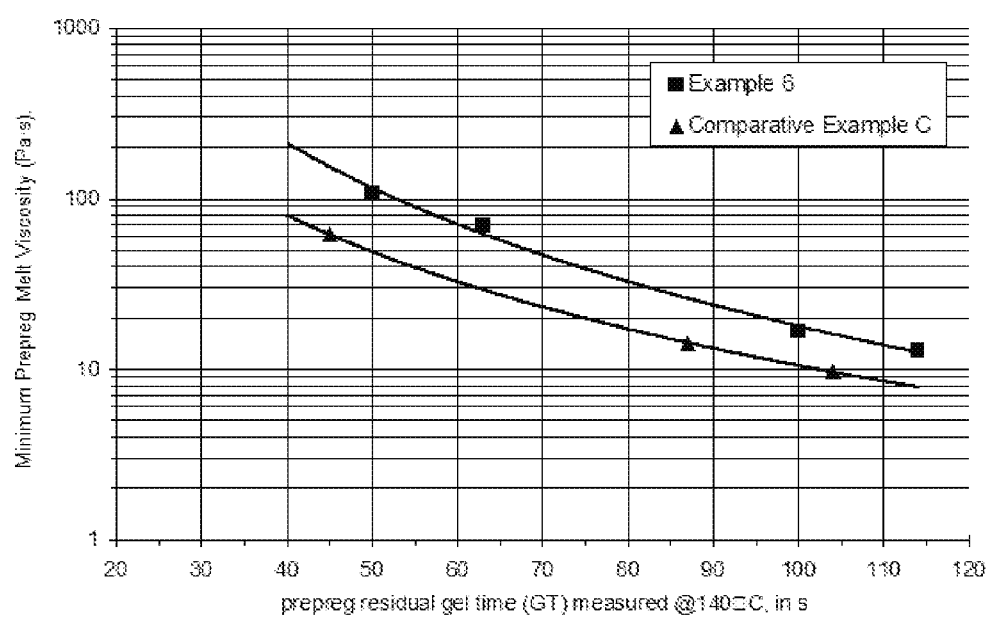

CURABLE EPOXY RESIN COMPOSITIONS HAVING IMPROVED ADHESION TO METAL SUBSTRATES AND PROCESSES FOR MAKING AND USING THE SAME

BACKGROUND OF THE INVENTION

The present invention relates to curable epoxy resin formulations useful for applications in which adhesion to metal substrates is important. In particular, this invention relates to curable epoxy resin compositions useful for applications such as metal coating compositions, composite materials, electrical laminates, electronic components, and circuit boards, and processes for making and using the same.

Thermoset resins are often used in coating compositions, composite materials, and electronic devices where strong adhesion to a metal substrate is important. While epoxy resins generally provide good adhesion to such substrates, there is room for improvement, especially in applications in which strong adhesion is important to the performance of the end product.

While the introduction of functional groups into resin compositions is known to increase adhesive strength, that approach tends to reduce other performance properties of the resin composition and tends to introduce processability problems. Simultaneously improving adhesion to metals while maintaining a high glass transition temperature, Tg, and high thermal stability, Td, has proven difficult.

In addition, viscosity control is an important issue in the processing of prepregs used to make composite materials and electrical laminates. The viscosity decrease of the resin in the prepreg during heating must be sufficient to permeate the composite material and make good contact with any materials with which the resin should adhere and yet should be sufficiently compensated by sufficient advancement of the resin to prevent an excessive amount of the resin from flowing out of the prepreg during pressing of the prepreg.

These and other problems relating to thermoset resin compositions are solved by the present invention described below.

SUMMARY OF THE INVENTION

The present invention provides thermosettable compositions having improved adhesion to metal substrates when cured comprising:
(a) at least one curable epoxy resin;
(b) at least one hardener, each hardener having less than 1 primary amine group per molecule and not more than 1 secondary amine group per molecule, the hardener(s) comprising at least one polyhydroxy hydrocarbon, compound capable of generating multiple hydroxy groups per molecule during curing of the thermosettable material, or poly(acid anhydride)hydrocarbon other than a blend of (1) a copolymer of an ethylenically unsaturated anhydride and a vinyl compound and (2) a copolymer of an ethylenically unsaturated anhydride and an elastomer; and
(c) at least one triblock copolymer comprising at least one elastomeric block per triblock unit and at least one acrylic block per triblock unit.

The present invention also provides a process for making a coated article comprising coating an article with at least one of the above thermosettable compositions and heating the coated article to cure the coating.

Another aspect of the present invention is a process for making a fiber-reinforced composite article comprising impregnating a fabric with at least one of the above compositions and heating the impregnated fabric to form a fiber-reinforced composite article. This process may be used to make prepregs, laminates, and printed wiring boards useful in the electronics field.

A further aspect of the present invention is coated articles, fiber-reinforced composites, prepregs, laminates and printed wiring boards made with at least one of the above compositions.

BRIEF DESCRIPTION OF THE DRAWINGS

FIG. 1 is a plot of prepreg minimum melt viscosity relative to prepreg residual gel time obtained in Comparative Example C and Example 6 of the present invention.

DETAILED DESCRIPTION OF THE INVENTION

For purposes of United States patent practice, the contents of any patent, patent application, or publication referenced herein are hereby incorporated by reference in its entirety (or the equivalent U.S. version thereof is so incorporated by reference), especially with respect to the disclosure of synthetic techniques, raw materials, and general knowledge in the art.

Unless stated to the contrary, implicit from the context, or customary in the art, all parts and percents are based on weight. The expression, "wt. %" means "weight-percent" and the expression, "mol %" means "mole-percent".

The abbreviation "EEW" means "epoxy equivalent weight".

The abbreviation "OHEW" means "phenol hydroxyl equivalent weight".

The abbreviation NV refers to "nonvolatile" weight or weight-percent of a material after solvents are removed in a vacuum oven at 150° C. for one hour.

If appearing herein, the term "comprising" and derivatives thereof is not intended to exclude the presence of any additional component, step or procedure, whether or not the same is disclosed herein. In order to avoid any doubt, all compositions claimed herein through use of the term "comprising" may include any additional additive, adjuvant, or compound, unless stated to the contrary. In contrast, the term, "consisting essentially of" if appearing herein, excludes from the scope of any succeeding recitation any other component, step or procedure, excepting those that are not essential to operability. The term "consisting of", if used, excludes any component, step or procedure not specifically delineated or listed. The term "or", unless stated otherwise, refers to the listed members individually as well as in any combination.

Unless stated otherwise, the term "lower alkyl" as used herein means a methyl group or a straight-chain or branched-chain alkyl group having 2 to 6 carbon atoms.

Unless stated otherwise, the terms "hydrocarbon", "hydrocarbyl" and "hydrocarbylene" refer to compounds, monovalent substituents, and multivalent linking groups, respectively, comprising carbon atoms and hydrogen atoms covalently bonded to each other. They preferably contain up to about 30 carbon atoms. In some embodiments, they preferably contain up to about 24 carbon atoms and more up to about 12 carbon atoms, including branched or unbranched, saturated or unsaturated, noncyclic or cyclic, moieties, such as alkyl groups, alkenyl groups, cycloalkyl groups, aryl groups, and the like. Such structures or moieties may contain atoms other than, and in addition to, carbon and hydrogen (referred to herein as "hetero" atoms) insofar that the hetero atoms do not add significant reactive functionality to such moieties. An example of such acceptable hetero atoms are ether oxygen atoms and secondary and tertiary nitrogen atoms. Unless stated otherwise, such compounds, substituents and linking groups preferably do not contain any hetero atoms.

The term "hetero" or "hetero-atom" refers to one or more non-carbon atoms, especially Si, B, N, P, O and S atoms.

Unless stated otherwise, "reactive monomer" as used herein means a chemical group capable of reacting with the oxirane functional groups of the epoxy molecules or with the chemical groups of the hardener(s).

As used herein, the term "hardener" refers to compounds having more than two functional groups per molecule that are capable of reacting with epoxy groups of the epoxy resin component of the compositions of the present invention and compounds capable of generating more than two functional groups per molecule during curing of the thermosettable compositions according to this invention, wherein the functional groups are groups selected from hydroxy groups and acid anhydride groups. The functional groups are capable of reacting with epoxy groups of the epoxy resin component, and optionally other compounds having functional groups, at an elevated temperature, optionally with the aid of one or more catalysts, to form a crosslinked thermoset material.

The terms "crystalline" and "semi-crystalline" refers to a polymer or oligomer that exhibits an X-ray diffraction pattern at 25° C. and possesses a first order transition or crystalline melting point (Tm) based on its differential scanning calorimetry heating curve.

As used herein, the term "chain extender" refers to compounds other than the hardener, epoxy resin and block copolymer components of the compositions of the present invention having only two functional groups per molecule. Each of the two functional groups is capable of reacting with an epoxy group at an elevated temperature, optionally with the aid of one or more catalysts, such that the polymer chains, and any branches thereof, of the epoxy resin component may be extended.

Unless stated otherwise, names of materials marked with the symbol "*" are trademarks of The Dow Chemical Company.

Epoxy Resin

The epoxy resin component used in the curable epoxy resin composition is a polyepoxide. The polyepoxide compound useful in the practice of the present invention is suitably a compound which possesses more than one 1,2-epoxy group. In general, the polyepoxide compound is a saturated or unsaturated aliphatic, cycloaliphatic, aromatic or heterocyclic compound which possesses more than one 1,2-epoxy group. The polyepoxide compound can be substituted with one or more substituents such as lower alkyl groups and halogen atoms. Such polyepoxide compounds are well known in the art. Illustrative polyepoxide compounds useful in the practice of the present invention are described in the *Handbook of Epoxy Resins* by H. E. Lee and K. Neville published in 1967 by McGraw-Hill, New York and U.S. Pat. No. 4,066,628.

Particularly useful polyepoxide compounds which can be used in the practice of the present invention are polyepoxides having the following general formula:

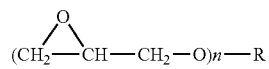

wherein R is a substituted or unsubstituted aromatic, aliphatic, cycloaliphatic or heterocyclic polyvalent group and "n" has an average value of from 1 to 7. As an illustration of the present invention, examples of known epoxy resins that may be used in the present invention, include for example, the polyglycidyl ethers, including but not limited to digycidyl ethers, of resorcinol, catechol, hydroquinone, bisphenol, bisphenol A, bisphenol AP (1,1-bis(4-hydroxylphenyl)-1-phenyl ethane), bisphenol F, bisphenol K, tetrabromobisphenol A, phenol-formaldehyde novolac resins, alkyl-substituted phenol-formaldehyde resins, phenol-hydroxybenzaldehyde resins, cresol-hydroxybenzaldehyde resins, dicyclopentadiene-phenol resins, dicyclopentadiene-substituted phenol resins, tetramethylbiphenol, tetramethyl-tetrabromobiphenol, tetramethyltribromobiphenol, tetrachlorobisphenol A, and any combination thereof.

Examples of diepoxides useful in the present invention include diglcidyl ether of 2,2-bis(4-hydroxyphenyl)propane (generally referred to as bisphenol A) and diglycidyl ether of 2,2-bis(3,5-dibromo-4-hydroxyphenyl)propane (generally referred to as tetrabromobisphenol A). Mixtures of any two or more polyepoxides can also be used in the practice of the present invention.

Particularly preferred epoxy resins include epoxy novolac resins (sometimes referred to as epoxidized novolac resins, a term which is intended to embrace both epoxy phenol novolac resins and epoxy cresol novolac resins) and epoxy bisphenol A novolac resins. Epoxy novolac resin compounds have the following general chemical structural formula (IA):

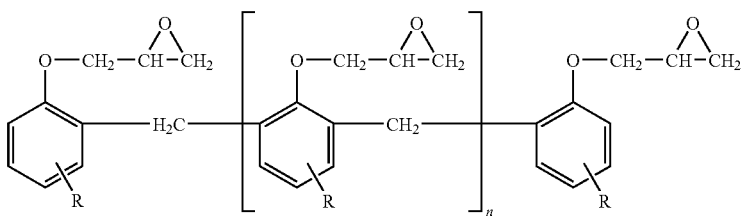

and bisphenol A novolac epoxy resins have the following general chemical structural formula (IB):

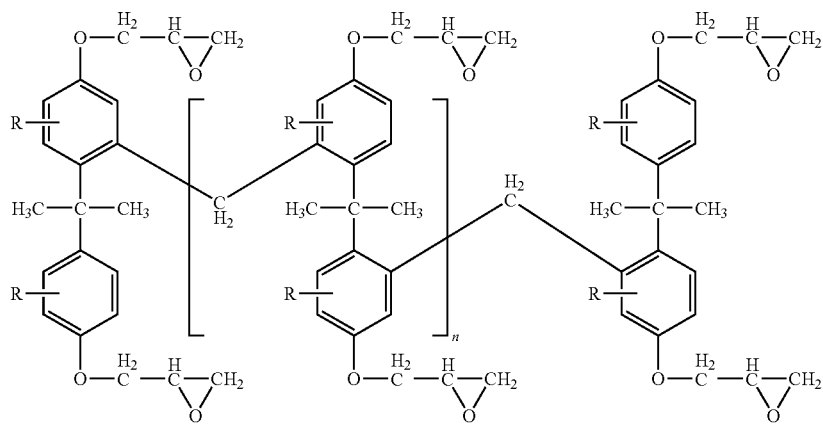

wherein "R" is hydrogen or a C1-C3 alkyl, e.g., methyl; and "n" is 0 or an integer from 1 to 10. "n" preferably has an average value of from 0 to 5. The preferred epoxy novolac resin is when each R is preferably a hydrogen atom in the above Formulae IA and IB.

Epoxy novolac resins (including epoxy cresol novolac resins) are readily commercially available, for example under the trade names D.E.N.*(available from The Dow Chemical Company), and Quatrex™ and tris epoxy such as Tactix™ 742 (available from Ciba Specialty Chemicals). Commercially available materials generally comprise mixtures of various species of the above formula. A convenient way of characterizing such mixtures is by reference to the average, n', of the values of n for the various species. Preferred epoxy novolac resins for use in accordance with the present invention are those in which n' has a value of from about 2.05 to about 10, more preferably from about 2.5 to about 5.

D.E.N.*438 or D.E.N.*439, commercially available from The Dow Chemical Company, are examples of preferred novolac resins.

Examples of bisphenol A novolac epoxy resins include EPIKURE™ YLH-129 available from Yuka Shell Epoxy K.K., Japan, and VH-4170 available from Dainippon Ink and Chemical Industries Co., Japan.

Other useful epoxide compounds which can be used in the practice of the present invention are cycloaliphatic epoxides. A cycloaliphatic epoxide consists of a saturated carbon ring having an epoxy oxygen bonded to two vicinal atoms in the carbon ring for example as illustrated by the following general formula IC:

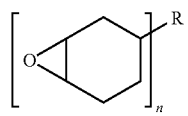

wherein R is as defined above and n is as defined above.

The cycloaliphatic epoxide may be a monoepoxide, a diepoxide, a polyepoxide, or a mixture of those. For example, any of the cycloaliphatic epoxides described in U.S. Pat. No. 3,686,359 may be used in the present invention. As an illustration, the cycloaliphatic epoxides that may be used in the present invention include, for example, (3,4-epoxycyclohexylmethyl)-3,4-epoxy-cyclohexane carboxylate, bis-(3,4-epoxycyclohexyl)adipate, vinylcyclohexene monoxide, and mixtures thereof. Examples of cycloaliphatic epoxides include E.R.L.*4221 and E.R.L.*4299 commercially available from The Dow Chemical Company.

Epoxy-terminated polyoxazolidones, such as those described in EP-A-478806 are also suitable for use with this invention.

To further improve heat resistance, the epoxy resin component used in the present invention may comprise multifunctional epoxy resin having an average of more than two epoxy groups per molecule. The epoxy resin having an epoxy functionality greater than two may be derived from one or more of the hardeners suitable for use in this invention described below, such as by reacting the same with epichlorohydrin, or may be branched epoxy-functional polyether polymers derived from diglycidyl ether, acid anhydride, and dihydric phenol compounds described in U.S. Pat. No. 6,710,139.

Preferred multi-functional epoxy resins include, for example, cresol-formaldehyde novolac epoxy resin, phenol-formaldehyde novolac epoxy resin, bisphenol A novolac epoxy resin, dicyclopentadiene phenol novolac epoxy resin, tris(glycidyloxyphenyl)methane, tetrakis(glycidyloxyphenyl)ethane, tetraglycidyldiaminodiphenylmethane, and mixtures thereof. To prevent the resultant reaction product from having high viscosity, tris(glycidyloxyphenyl)methane, tetrakis(glycidyloxyphenyl)ethane and tetraglycidyldiaminodiphenylmethane are preferred.

In view of cost performance, cresol-formaldehyde novolac epoxy resin, phenol-formaldehyde novolac epoxy resin and bisphenol A novolac epoxy resin are preferred.

In view of dielectric performance, dicyclopentadiene phenol novolac epoxy resin is preferred.

In addition, it is preferable to use a multifunctional epoxy resin having a narrow molecular weight distribution (e.g., a Mw/Mn value of from about 1.5 to about 3.0).

In a preferred embodiment, the epoxy resin component comprises a mixture of two or more of the above epoxy resins. In a more preferred embodiment, the mixture comprises epoxy resin molecules having an epoxy functionality of 2 and epoxy resin molecules having an epoxy functionality greater than 2.

Epoxy resins suitable for use in the present invention include flame resistant epoxy resins based on, or analogous to, the above-described epoxy resins.

One example of a flame resistant epoxy resin useful in the present invention is a brominated epoxy resin. The brominated epoxy resin component used in the curable epoxy resin composition of the present invention may be any brominated epoxy resin well known in the art. Examples of the bromine containing epoxy resins of the present invention include tetrabromobisphenol A, diglycidyl ether of tetrabromobisphenol A, and other brominated epoxies such as those commercially available from The Dow Chemical Company under the trademarks D.E.R.*560, D.E.R.*542, D.E.R.*592, D.E.R.*593, D.E.R.*530 and D.E.R.*538, and mixtures thereof. A preferred bromine-containing epoxy resin used in the present invention includes diglycidyl ether of tetrabromobisphenol A such as D.E.R.*560.

The compositions according to the present invention may contain one or more brominated epoxy resins. Different brominated epoxy resins may be blended together to make up the flame retardant epoxy component of the present invention. If the composition contains one or more brominated epoxy resins, the bromine content of the epoxy resin composition may be from about 5 wt. % to about 40 wt. %, preferably from about 10 wt. % to about 30 wt. %, more preferably from about 12 wt. % to about 25 wt. %, and even more preferably from about 14 wt. % to about 21 wt. %.

The flame retardant epoxy resins useful in the present invention also include phosphorous-containing epoxy resins, such as those disclosed in US-A-2002/0119317, WO 2005/118604, U.S. Pat. No. 6,403,220, and WO 99/00451. Other examples of phosphorus element-containing epoxy resins useful in the present invention are those obtained by epoxidizing a phosphorus element-containing compound including the epoxidized product of a phosphorus element-containing compound such as 9,10-dihydro-9-oxa-10-phosphaphenanthrene-10-oxide such as "Sanko-HCA," commercially available from Sanko Co., Ltd., of Japan, or "Struktol Polydis PD 3710," commercially available from Schill-Seilacher GmbH of Germany; 10-(2',5'-dihydroxyphenyl)-9,10-dihydro-9-oxa-10-phosphaphenanthrene-10-oxide (such as "Sanko HCA-HQ"); bis(4-hydroxyphenyl)-phosphine oxide; tris(2-hydroxyphenyl)phosphine oxide; dimethyl-1-bis(4-hydroxyphenyl)-1-phenylmethylphonate; tris(2-hydroxy-4/5-methylphenyl)phosphine oxide tris(4-hydroxyphenyl)phosphine oxide, bis(2-hydroxyphenyl)phenylphosphine oxide, bis(2-hydroxyphenyl)phenylphosphinate, tris(2-hydroxy-5-methylphenyl)phosphine oxide; or mixtures thereof. The epoxidizing of the phosphorus element-containing compound is usually carried out with an epihalohydrin such as epichlorohydrin well known to those skilled in the art.

The present invention composition may contain one or more phosphorous-containing epoxy resins. Different phosphorous containing epoxy resins may be blended together to make up the flame retardant epoxy component of the present invention. If the composition contains one or more phosphorus-containing epoxy resins, the phosphorous content of the epoxy resin composition may be from about 0.05 wt. % to about 20 wt. %, preferably from about 1 wt. % to about 10 wt. %, and more preferably from about 2 wt. % to about 5 wt. %.

The present invention may contain a combination of one or more of the above-described brominated epoxy resins with one or more of the above-described phosphorus-containing epoxy resins and/or one or more of the above-described phosphorus-containing compounds.

Hardener

Hardeners suitable for use in this invention comprise at least one polyhydroxy hydrocarbon, compound capable of generating multiple hydroxy groups per molecule during curing of the thermosettable material, or poly(acid anhydride) hydrocarbon.

Suitable polyhydroxy hydrocarbons include phenolic hardeners. Phenolic hardeners are compounds, either polymeric or monomeric, which have more than 2 phenolic hydroxyl (—OH) groups capable of reacting with epoxy groups at elevated temperatures. The phenolic hardeners include various types of compounds such as:

Phenolic resins obtained by reacting phenols or alkyl phenols with formaldehyde, such as the phenol novolacs or resoles described in WO 01/42359 and Lee & Neville, McGraw-Hill (New York, 1967), sections 11-14; 3,4,5-trihydroxybenzoic acid (also known as gallic acid) or its derivatives, or pyrogallol (also known as 1,2,3-trihydroxybenzol), or 1,2,4-trihydroxybenzol (also known as hydroxyhydrochinon); 1,8,9-trihydroxyanthracene (also known as dithranol or 1,8,9-anthracentriol), or 1,2,10-trihydroxyanthracene (also known as anthrarobine); 2,4,5-trihydroxypyrimidine; tris(hydroxyphenyl)methane; dicylcopentadiene phenol novolac; tetraphenolethane, such as Durite™ SD 1731 from Borden Chemical, Inc.; and copolymers of styrene and hydroxystyrene.

The chemical structure of some of the phenolic hardeners described above are as follows:

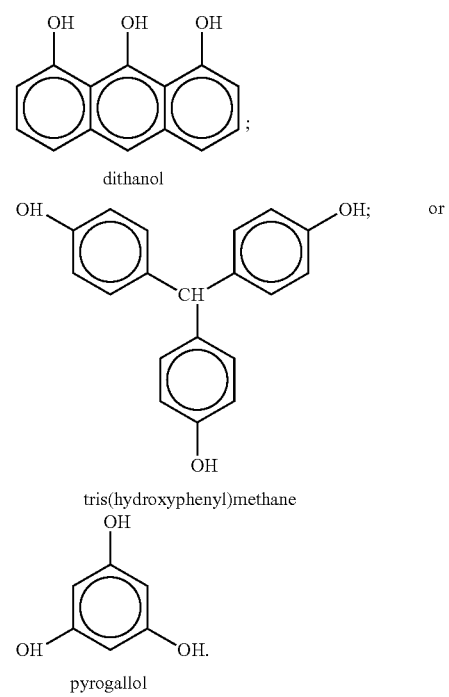

Suitable phenolic hardeners include compounds represented by the formula (IIA):

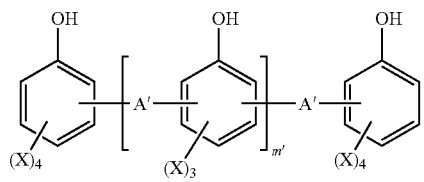

or (IIB):

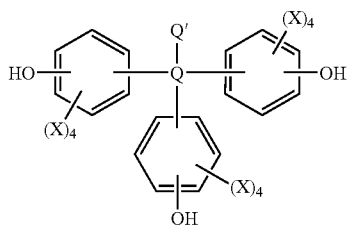

in which each A' independently represents a hydrocarbylene group group having from 1 to 9, preferably from 1 to 4, carbon atoms, Q represents a hydrocarbyl group having from 1 to 10 carbon atoms, Q' represents a hydrogen atom, an alkyl group having from 1 to 4 carbon atoms, or a phenol group, each X independently represents a hydrogen atom, a bromine atom, a chlorine atom, or a hydrocarbyl group having from 1 to 9, preferably 1 to 4, carbon atoms, and m' represents a value in the range from 0.01 to 10, preferably from 0.2 to 8, even more preferably from 0.5 to 6, and yet more preferably from 1 to 5.

The phenolic hardener is preferably a novolac, bisphenol A novolac or cresol novolac obtainable by condensation of phenols, bisphenol A, cresols, xylenols and/or other alkyl phenols with a formaldehyde. Also, in the present invention, resoles may be used as phenolic hardener.

Preferably, the phenolic hardeners used in the present invention have the following chemical structural formula (IIC):

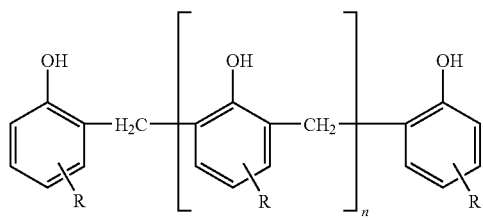

or chemical structural formula (IID):

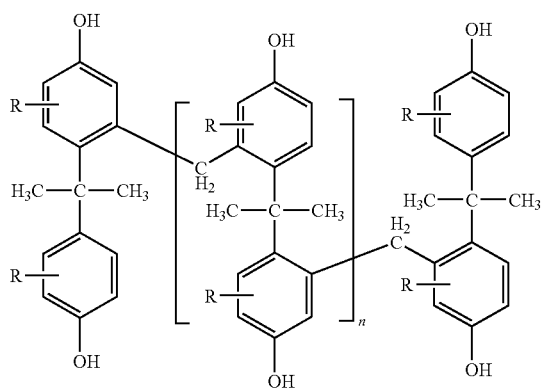

wherein "R" is hydrogen or a C1-C3 alkyl, e.g., methyl; and "n" is 0 or an integer from 1 to 10. "R" is preferably hydrogen and "n" preferably has an average value of from 1 to 5.

Commercially available products having the above general Formula (IIC) include, for example, Prefere™ (formerly Perstorp™) 85.36.28, which is a phenolic resin obtained from phenol and formaldehyde having an average Mettler softening point of 103° C., melt viscosity at 150° C.=1.2 Pa·s and a functionality in the range from 4 to 5 available from Dynea OY of Helsinki, Finland.

Commercially available products having the above general Formula (IID) include, for example, BPN-17, which is commercially available from Arakawa Chemical Industries, Ltd., of Japan, and N-850A and N-865 available from Dainippon Ink and Chemical Industries, Inc., also of Japan.

Compounds capable of generating multiple hydroxy groups per molecule during curing of the thermosettable material are preferably organic compounds, and are more preferably aryl rings fused to a heterocyclic ring. Examples of compounds which form a phenolic hardener upon heating include phenolic species obtained from heating benzoxazine, for example as illustrated in the following chemical equation:

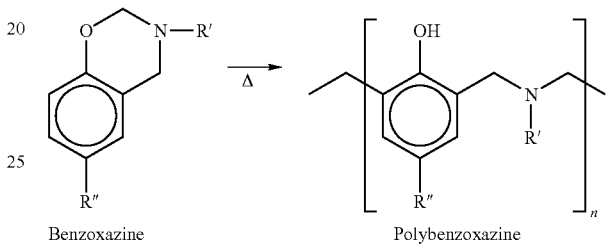

Benzoxazine      Polybenzoxazine wherein n is greater than 1; and wherein R' and R'' may be, independently and separately, the same or different, hydrogen, an allyl group from C1-C10 such as methyl, a C6-C20 aromatic group such as phenyl or a C4-C20 cycloaliphatic group such as cyclohexane.

Examples of such compounds also include benzoxazine of phenolphthalein, benzoxazine of bisphenol-A, benzoxazine of bisphenol-F, benzoxazine of phenol novolac and the like. Mixtures of phenolic hardeners and compounds which form a phenolic hardener upon heating may also be used.

Suitable poly(acid anhydride)hydrocarbons include copolymers of an ethylenically unsaturated anhydride and a vinyl compound, copolymers of an ethylenically unsaturated anhydride and an elastomer, and maleic anhydride adducts of methylcyclopentadiene.

Preferred copolymers of an ethylenically unsaturated anhydride and a vinyl compound include styrene-maleic anhydride (SMA) copolymers and others as described, for example, in WO 95/06075. Preferred styrene-maleic anhydride copolymers include copolymers of styrene and maleic anhydride having a $M_W$ in the range of from 1,500 to 50,000 and an anhydride content of more than 15 wt. %. Commercial examples of these materials include SMA 1000, SMA 2000, SMA 3000, and SMA 4000 having styrene-maleic anhydride ratios of 1:1, 2:1, 3:1 and 4:1, respectively, and having a $M_W$ ranging from 6,000 to 15,000, available from Atofina of Puteaux, France.

Preferred copolymers of an ethylenically unsaturated anhydride and an elastomer include maleinized polybutadiene (PBMA). The PBMA used in the present invention may, for example, be Ricon® MA resins commercially available from Sartomer Company, Inc., of Exton, Pa., U.S.A. The maleinized polybutadiene used in the present invention may also be prepared according to various known techniques such as by reacting polybutadiene with maleic anhydride as described in U.S. Pat. No. 4,028,437, U.S. Pat. No. 4,601,944, and U.S. Pat. No. 5,300,569.

The hardener preferably contains a total of at least 50, more preferably at least 75, and even more preferably at least 90, wt. % phenolic hardener and/or compound capable of forming a hardener having phenolic hydroxyl groups.

The hardener preferably contains not more than 50, more preferably not more than 25, and even more preferably not more than 10, wt. % styrene-maleic anhydride copolymer. In a preferred embodiment, the hardener preferably contains not more than 50, more preferably not more than 25, and even more preferably not more than 10, wt. % poly(acid anhydride) hydrocarbons, such as copolymers of an ethylenically unsaturated anhydride and a vinyl compound, copolymers of an ethylenically unsaturated anhydride and an elastomer, and maleic anhydride adducts of methylcyclopentadienestyrene-maleic anhydride copolymer, individually and/or collectively.

The weight-ratio of the total amount of (a) poly(acid anhydride) hydrocarbon hardener to (b) phenolic hardener and/or compound capable of forming a hardener having phenolic hydroxyl groups is preferably not greater than 1:1, more preferably not greater than 1:3, and even more preferably not greater than 1:10.

The hardener is preferably present in the thermosettable compositions according to this invention an amount of at least 50 percent, more preferably at least 75 percent, and even more preferably at least 85 percent, up to 150 percent, more preferably up to 125 percent, and even more preferably up to 110 percent, of the stoichiometric amount needed to cure the epoxy resin.

Triblock Copolymer

The triblock copolymer comprises at least one elastomeric block, hereafter referred to as "B" blocks or simply "B", and at least one acrylic block, hereinafter referred to as "M" blocks or simply "M". The triblock copolymer is preferably substantially, or predominantly, amorphous at ambient temperatures or is preferably substantially amorphous at −10° C., more preferably at −20° C., even more preferably at −30° C., and yet more preferably at −40° C.

The "B" blocks may be derived from monomer units comprising at least one diene. Examples of dienes include butadiene, isoprene, 2,3-dimethyl-1,3-butadiene, 1,3-pentadiene or 2-phenyl-1,3-butadiene.

The "B" blocks may also be derived from monomer units comprising at least one alkyl (meth)acrylate having a Tg less than −20° C., more preferably less than −40° C., and even more preferably less than −50° C. Examples of such monomer units include ethyl acrylate (Tg=−24° C.), butyl acrylate (Tg=−54° C.), and 2-ethylhexyl acrylate (Tg=−85° C.). The alkyl (meth)acrylates of the "B" blocks are selected to be different from those in the "M" blocks to ensure that the "B" blocks and the "M" blocks do not have the same compatibility with the epoxy resin component.

The "B" blocks preferably comprise at least 80 mol %, more preferably at least 90 mol %, and even more preferably 100 mol %, monomer units derived from the foregoing preferred diene or alkyl (meth)acrylate monomer units.

In a preferred embodiment, the "B" blocks comprise at least one poly(diene), such as a poly(butadiene), poly(isoprene) and their random copolymers, or partially or completely hydrogenated poly(dienes). Particularly preferred are polybutadienes having a low Tg, such as 1,4-polybutadiene, which has a Tg of approximately −90° C. These "B" blocks may be partially or fully hydrogenated.

In another preferred embodiment, the "B" blocks comprise at least one polyorganosiloxane. The polyorganosiloxane preferably comprises multiple [—Si(R)(R')O—] units in which each R and R' independently represents a C1-C8 hydrocarbyl group, such as a methyl group, ethyl group, propyl group, isopropyl group, etc. The R and R' groups preferably represent methyl groups and more preferably each R and R' represents a methyl group.

The "M" blocks may be derived from monomers comprising at least 50 wt. %, more preferably at least 75 wt. %, methyl methacrylate. The other monomers constituting the acrylic block may be acrylic or nonacrylic monomers and may or may not be reactive. Examples of reactive functional groups include oxirane functional groups, amine functional groups or carboxyl functional groups. The reactive monomer may be (meth)acrylic acid or a hydrolysable monomer which converts to (meth)acrylic acid upon hydrolysis. Examples include glycidyl methacrylate or tert-butyl methacrylate.

The "M" blocks preferably comprise syndiotactic poly (methylmethacrylate) (PMMA). In a preferred embodiment, the "M" blocks comprise at least 60 wt. % syndiotactic PMMA.

The "M" blocks have a Tg which is preferably at least 50° C., more preferably at least 100° C., and even more preferably at least 150° C., greater than the Tg of the "B" blocks. The "M" blocks have a Tg that is preferably greater than or equal to −20° C., more preferably greater than or equal to 0° C., even more preferably greater than or equal to 50° C., and even more preferably greater than or equal to 80° C.

The triblock copolymer may optionally contain crystalline or semi-crystalline blocks, hereinafter referred to as "S" blocks or simply "S", having a Tg or melt temperature greater than 23° C. and preferably greater than 50° C. Examples include blocks derived from monomer units comprising at least one vinylaromatic compound, such as styrene, α-methylstyrene or vinyltoluene, blocks derived from monomer units comprising an alkylene oxide (preferably a straight-chain alkylene oxide, such as ethylene oxide or propylene oxide), and blocks derived from monomer units comprising alkyl esters of acrylic acid and/or methacrylic acid having from 1 to 18 carbon atoms in the alkyl chain. These acrylates are selected to be different from those of the "M" blocks, so as to ensure that the "S" blocks and the "M" blocks do not have the same compatibility with the epoxy resin component.

The "S" blocks have a Tg that is preferably at least 50° C., more preferably at least 100° C., even more preferably at least 150° C., greater than the Tg of the "B" blocks. The "S" blocks preferably have a $M_w$ in the range from 500 to 100,000.

The triblock copolymer may comprise M-B-M triblocks. The two "M" blocks of the M-B-M triblock may be identical or different. They may also be different in their molar mass and composed of the same or different monomers. The "B" blocks of the M-B-M triblock may be identical or different.

The M-B-M triblock copolymers preferably contain at least 10 wt. %, more preferably at least 15 wt. %, up to 80 wt. %, and more preferably up to 70 wt. %, "M" blocks and at least 20 wt. %, more preferably at least 30 wt. %, up to 90 wt. %, more preferably up to 85 wt. %, "B" blocks.

Alternatively, the triblock copolymer may comprise S—B-M triblocks. The S—B-M copolymers preferably contain at least 5 wt. %, more preferably at least 15 wt. %, up to 80 wt. %, more preferably up to 50 wt. % "S" blocks, preferably at least 5 wt. %, more preferably at least 15 wt. %, up to 80 wt. %, more preferably up to 50 wt. %, "B" blocks, and preferably at least 20 wt. %, more preferably at least 40 wt. %, up to 80 wt. %, more preferably up to 70 wt. %, "M" blocks.

The triblock copolymers preferably have a number-average molecular weight ($M_n$) of at least 10,000 g/mol, more preferably at least 20,000 up to 500,000 g/mol, more preferably up to 200,000 g/mol.

Suitable triblock copolymers may be manufactured by anionic polymerization, such as via the processes disclosed in EP-A-524,054 and EP-A-749,987.

Optional Components

The compositions of the present invention may contain a catalyst capable of promoting the reaction between the hardener with the epoxy resin and promoting the curing of the epoxy resin. Examples of suitable catalyst materials useful in the present invention include compounds containing amine, phosphine, ammonium, phosphonium, arsonium, or sulfonium moieties. Particularly preferred catalysts are heterocyclic nitrogen-containing compounds.

The catalysts (as distinguished from hardeners) preferably contain on average no more than about 1 active hydrogen moiety per molecule. Active hydrogen moieties include hydrogen atoms bonded to an amine group, a phenolic hydroxyl group, or a carboxylic acid group. For instance, the amine and phosphine moieties in catalysts are preferably tertiary amine or phosphine moieties; and the ammonium and phosphonium moieties are preferably quaternary ammonium and phosphonium moieties.

Among preferred tertiary amines that may be used as catalysts are those mono- or polyamines having an open-chain or cyclic structure which have all of the remaining amine hydrogen atoms replaced by suitable substituents, such as hydrocarbyl radicals, and preferably aliphatic, cycloaliphatic or aromatic radicals. Examples of these amines include, among others, 1,8-diazabicyclo(5.4.0) undec-7-en (DBU), methyl diethanol amine, triethylamine, tributylamine, dimethyl benzylamine, triphenylamine, tricyclohexyl amine, pyridine and quinoline. Preferred amines are the trialkyl, tricycloalkyl and triaryl amines, such as triethylamine, triphenylamine, tri-(2,3-dimethylcyclohexyl)amine, and the alkyl dialkanol amines, such as methyl diethanol amines and the trialkanolamines such as triethanolamine. Weak tertiary amines, for example, amines that in aqueous solutions give a pH less than 10 in aqueous solutions of 1 M concentration, are particularly preferred. Especially preferred tertiary amine catalysts are benzyldimethylamine and tris-(dimethylaminomethyl)phenol.

Examples of suitable heterocyclic nitrogen-containing catalysts include those described in U.S. Pat. No. 4,925,901. Preferable heterocyclic secondary and tertiary amines or nitrogen-containing catalysts which can be employed herein include, for example, imidazoles, benzimidazoles, imidazolidines, imidazolines, oxazoles, pyrroles, thiazoles, pyridines, pyrazines, morpholines, pyridazines, pyrimidines, pyrrolidines, pyrazoles, quinoxalines, quinazolines, phthalozines, quinolines, purines, indazoles, indoles, indolazines, phenazines, phenarsazines, phenothiazines, pyrrolines, indolines, piperidines, piperazines and combinations thereof. Especially preferred are the alkyl-substituted imidazoles; 2,5-chloro-4-ethyl imidazole; and phenyl-substituted imidazoles, and mixtures thereof. Even more preferred are N-methylimidazole; 2-methylimidazole; 2-ethyl-4-methylimidazole; 1,2-dimethylimidazole; and 2-methylimidazole. Especially preferred is 2-phenylimidazole.

The total amount of the catalyst is from about 0.01 wt % to about 3 wt %, based on the total weight of the composition, preferably from about 0.1 wt % to about 2% wt %. The total amount of primary amine ($-NH_2$) is not more than 5000 ppm by weight, preferably not more than 2500 ppm, more preferably not more than 500 ppm, even more preferably not more than 50 ppm. The total amount of secondary amine ($-NH$) is not more than 10000 ppm by weight, preferably not more than 4000 ppm, more preferably not more than 2000 ppm, even more preferably not more than 1000 ppm.

Preferably, a Lewis acid, or anhydride of a Lewis acid, is also employed in the composition of the present invention, especially when the catalyst is a heterocyclic nitrogen-containing compound. Examples of heterocyclic nitrogen-containing catalysts, which are preferably used in combination with Lewis acids are those described in EP-A-526,488, EP-A-458,502, and GB-A-9421405.3. The Lewis acids useful in the present invention include, for example, halides, oxides, hydroxides and alkoxides of zinc, tin, titanium, cobalt, manganese, iron, silicon, aluminum, boron, and other Lewis acids that tend to have a relatively weak conjugate base. An example of a zinc halide is zinc chloride.

Preferably, the Lewis acid is a Lewis acid of boron, or an anhydride of a Lewis acid of boron, for example boric acid, metaboric acid, an optionally substituted boroxine (such as trimethoxy boroxine, trimethyl boroxine or triethyl boroxine), an optionally substituted oxide of boron, or an alkyl borate. The most preferred Lewis acid is boric acid. These Lewis acids are very effective in curing epoxy resins when combined with the heterocyclic nitrogen-containing compounds described above.

The Lewis acids and amines can be combined before mixing into the formulation, or by mixing with the catalyst in-situ, to make a curing catalyst combination. The amount of the Lewis acid employed is preferably at least 0.1 moles of Lewis acid per mole of heterocyclic nitrogen compound, more preferably at least 0.3 moles of Lewis acid per mole of heterocyclic nitrogen-containing compound. The formulation preferably contains no more than 5 moles of Lewis acid per mole of catalyst, more preferably contains no more than 4 moles of Lewis acid per mole of catalyst and most preferably contains no more than 3 moles of Lewis acid per mole of catalyst.

The compositions of the present invention may also optionally contain one or more chain extenders. Chain extenders are compounds other than epoxy resins having two functional groups per molecule which are capable of reacting with an epoxy group. The functional groups is preferably selected from phenolic hydroxyl, amine, isocyanate, thiol, and carboxylic acid groups. The functional groups preferably comprise at least one phenolic hydroxyl group per molecule, and more preferably two phenolic hydroxyl groups per molecule.

Included among the preferred chain extenders are bisphenol A, bisphenol F, and tetrabromobisphenol A.

The compositions according to the present invention containing one or more chain extenders may be obtained by combining the at least one epoxy resin and at least one block copolymer with a composition containing a mixture of one or more hardeners with one or more chain extending agent, the mixture having an average functionality greater than 2.0, preferably at least 2.2, more preferably at least 3, and even more preferably at least 4. The molar ratio of hardener to chain extender is preferably at least 1:1, and more preferably at least 2:1 and even more preferably at least 4:1, and preferably up to 1:3, more preferably up to 1:2.

The compositions of the present invention may also optionally contain one or more flame retardant additives including, for example, red phosphorus, encapsulated red phosphorus or liquid or solid phosphorus-containing compounds, for example, ammonium polyphosphate such as "Exolit 700" from Clariant GmbH, a phosphite, or phosphazenes; nitrogen-containing fire retardants and/or synergists, for example melamines, melem, cyanuric acid, isocyanuric acid and derivatives of those nitrogen-containing compounds; halogenated flame retardants; synergistic phosphorus-halogen containing chemicals or compounds containing salts of organic acids; inorganic metal hydrates such as $Sb_2O_3$, $Sb_3O_5$, aluminum trihydroxide and magnesium hydroxide such as "Zerogen™ 30" from Martinswerke GmbH of Germany, and more preferably, an aluminum trihydroxide such as "Martinal™ TS-610" also from Martinswerke GmbH of Germany; boron-containing compounds; antimony-containing compounds; and combinations thereof. Examples of suitable additional flame retardant additives are given in a paper presented at "Flame retardants-101 Basic Dynamics-Past efforts create future opportunities", Fire Retardants Chemicals Association, Baltimore Marriot Inner Harbour Hotel, Baltimore Md., U.S.A., 24-27 Mar. 1996.

The epoxy resin composition of the present invention may also optionally contain other additives of a generally conventional type including fillers, stabilizers, other organic or inorganic additives, pigments, wetting agents, flow modifiers, UV light blockers, and fluorescent additives. Examples of suitable additives are also described in U.S. Pat. No. 5,066,735 and in C.A. Epoxy Resins, second edition, pp. 506-512 (Mercel Dekker, Inc. 1988).

Solvents may also optionally be used in the composition of the present invention. Suitable solvents include propylene glycol methylether (DOWANOL*PM), methoxypropylacetate (DOWANOL*PMA), methylethylketone (MEK), acetone, methanol, and combinations thereof. When a solvent is used in the present invention, the amount of solvent present in the thermosetting composition of the present invention is generally form 0 wt. % to about 50 wt. %; preferably from about 10 wt. % to about 45 wt. % and more preferably from about 15 wt. % to about 40 wt. %, depending on the end use application of the epoxy resin composition.

End-Use Applications

The compositions of the present invention can be used to make composite materials by techniques well known in the industry such as by pultrusion, moulding, encapsulation, or coating. The present invention is particularly useful for coating metals, such as for can-coating applications, and for making B-staged prepregs and laminates by well-known techniques in the industry.

An advantage of the present invention is that the formulations can have a minimum melt viscosity which is greater than that of corresponding state of the art formulations, which provides more consistent laminate and composite thickness and reduces resin waste due to resin flowing out of the prepreg or composite when simultaneously heating and pressing prepregs and composites during processing. Prepreg minimum melt viscosity determined by the method described below for a formulation having a prepreg gel time of 60 seconds (determined according to IPC-TM-650-2.3.18A) is preferably at least 20, more preferably at least 30, even more preferably at least 40, and even more preferably at least 60, Pa·s and preferably up to 400, more preferably up to 300, even more preferably up to 200, and yet more preferably up to 150, Pa·s.

Another advantage of the present invention is that the formulation has improved adhesion to a metal substrate when cured in contact with the metal substrate. The formulation when cured has a copper peel strength determined according to IPC-TM-650-2.4.8C that is preferably at least 10, more preferably at least 12, even more preferably at least 14, and yet more preferably at least 16, N/cm.

EXAMPLES

The invention is further illustrated by the following examples that should not be regarded as limiting of the present invention. Unless stated to the contrary or conventional in the art, all parts and percents are based on weight.

Test Materials

| Name | Source | Description |
|---|---|---|
| D.E.N.*438 | (1) | multifunctional epoxy novolac resin, EEW = 180 |
| Dowanol* PM | (1) | propylene glycol methyl ether |
| Dowanol* PMA | (1) | propylene glycol methyl ether acetate |
| Durite ™ SD-357 | (4) | tetraphenolethane (TPE), OHEW = 140 |
| Epilox ™ B45-03 | (2) | brominated epoxy resin, EEW = 450 |
| Prefere ™ 4536U | (3) | phenol novolac resin, OHEW = 105 (formerly Peracit ™ 4536U) |
| SBM E-40 | (7) | styrene-butadiene-methyl methacrylate triblock copolymer, 40% NV in MEK |
| SBM E-41 | (7) | styrene-butadiene-methyl methacrylate triblock copolymer, 40% NV in MEK |
| SMA 3000 | (6) | styrene-maleic anhydride, anhydride EW = 395 |

| Abbreviation | Source | Description |
|---|---|---|
| 2-PI | (8) | 2-phenyl-imidazole |
| 2-E4MI | (8) | 2-ethyl-4-methyl-imidazole |
| — | (8) | boric acid |
| MEK | (1) | methyl ethyl ketone |
| TBBA | (5) | tetrabromobisphenol A, OHEW = 274 |
| TPP | (8) | triphenyl phosphine |

Key to Sources (1) The Dow Chemical Company, U.S.A.
(2) Leuna-Harze GmbH, Leuna, Germany
(3) Dynea OY of Helsinki, Finland
(4) Borden Chemical, Inc., U.S.A.
(5) Great Lakes Chemical Corporation, U.S.A.
(6) Atofina of Puteaux, France
(7) Arkema, Inc., U.S.A.
(8) Sigma-Aldrich, Inc., St. Louis, MO, U.S.A.

Test Protocols

Procedure for Making Laminates:

The procedure for making laminates used for the Examples and Comparative Examples is as follows:

The respective varnish formulations are used to impregnate 7628 type woven glass cloth. The impregnated woven glass cloth is heated (i.e., advanced) in a vertical treater oven operated at 175° C. to form a prepreg roll. The prepreg roll is cut into 12×12 inch$^2$ (30×30 cm$^2$) sheets. Eight prepreg sheets are stacked between two sheets of copper foil. Each stack is pressed at 190° C. for 90 minutes to obtain laminates having a thickness of about 1.5 mm and a laminate resin content of about 43 wt. %.

The standard methods used in the Examples and Comparative Examples to measure certain properties are as follows:

| IPC Test Method | Property Measured |
| --- | --- |
| IPC-TM-650-2.3.16.1C | Resin content of prepreg, by treated weight [resin content] |
| IPC-TM-650-2.3.18A | Gel time, prepreg materials [prepreg gel time] Analogous method used to determine varnish gel time |
| IPC-TM-650-2.3.40 | Thermal stability [Td] at 10° C./min. heating ramp |
| IPC-TM-650-2.4.8C | Peel strength of metallic clad laminates [copper peel strength (CPS)] |
| IPC-TM-650-2.4.24.1 | Time to delamination (TMA Method) [T260, T288, T300] |
| IPC-TM-650-2.4.25C | Glass transition temperature and cure factor by DSC [Tg] determined on films with a heating ramp of 10° C./min. and on laminates with a heating ramp of 20° C./min. |

Description of Test Method Used to Determine MMV:

MMV is determined according to ASTM 4287 using a cone and plate rheometer operating at a constant temperature of 140° C. About 0.2 g prepreg powder is molten in the rheometer and the viscosity is recorded as a function of time. MMV is determined by the value corresponding to the minimum melt viscosity reached during the test.

Description of Test Methods Used to Characterize Laminate Toughness:

Laminate Fracture Toughness:

Measured in accordance with ASTM D5528 using Mode I, tensile mode. For this test a 16-ply, unclad laminate is used in order to enhance bending stiffness. A thin sheet of Mylar is inserted from one edge (~3 in. long, i.e., ~7.6 cm. long) in the middle of the lay-up during the stacking of the prepreg prior to consolidation. This acts as the crack initiator for the fracture test. Once the laminate is consolidated, test specimens 1×7 in$^2$ (2.5×18 cm$^2$) are cut from the composite panel using a wet circular saw and then ground to ensure that the edges are parallel. Metallic blocks are then glued to the specimens and held overnight to ensure full cure. The samples are then gripped onto a MTS 810 servo-hydraulic test frame at a fixed loading rate of 0.2 inch/minute (0.5 cm./minute). The load and stroke signals are recorded during the test.

Drilling—Halo Determination:

This test evaluates the drillability of laminates and employs a drill press with ⅛ inch (0.32 cm.) bit size (spindle speed=3100 rpm, in-feed rate not controlled). Twelve holes are drilled from 3 sections (4 holes drilled per section; areas consist of ~2 inch (~5 cm.) from left and right edge and center section) of the laminate. A visible penetrant is applied around the hole wall interior and allowed to penetrate the fibers for ~10 minutes. The delamination zone or "halo" is then measured under a microscope using a ruler. The lower the halo diameter, the better the drillability.

Delamination Energy on Impact:

Energy required to reach delamination of the laminate on an impact. A BYK-Gardener impact tester is used with a 4 lb. (1.8 kg.) indentor. By gradually increasing the distance the weight drops, the height at which delamination occurs is determined. The energy of delamination, E, is calculated using the following equation:

$$E = 9.81 \text{ m/s}^2 * Hd * Wi$$

wherein

E=energy of delamination on impact (in joules)
Hd=maximum height without delamination (in meters)
Wi=indentor weight (in kg.)

The greater the energy of delamination E, the greater the laminate toughness.

Wt. % NV is determined by precisely weighing four samples of material placed in an aluminum cups before and after placing the sample in a vacuum oven operating at 150° C. for one hour (taking care to avoid excessive foaming of the material due to the vacuum). The weight of the aluminum cups is deducted from the sample before and after removal of volatile components in the oven. Wt. % NV=Σ(W2/W1× 100)/4 (i.e., the average wt. % NV, which is the sum of W2/W1×100 calculated for each sample divided by 4), where W1=weight before removal of volatile components—Tare and W2=weight after removal of volatile components—Tare.

Test Data and Results

The formulations used for comparative testing are described in Tables 1A, 2A and 3A below and the test data obtained with those formulations is shown in Tables 1B, 2B and 3B and FIG. 1 below.

Copper Peel Strength Test

The formulations used for comparative copper peel strength testing are provided in Tables 1A and 2A below and the test data obtained with those formulations is shown in Tables 1B and 2B below.

TABLE 1A

COMPOSITIONS OF EXAMPLES 1 TO 4 AND COMPARATIVE EXAMPLE A (CE-A)

| RAW MATERIALS | CE-A | Ex. 1 | Ex. 2 | Ex. 3 | Ex. 4 |
| --- | --- | --- | --- | --- | --- |
| D.E.N.* 438 (85 WT. % NV IN MEK) | 32.2 | 30.7 | 29.4 | 27.3 | 27.3 |
| EPILOX ™ B45-03 (70% WT. % NV IN DOWANOL* PMA) | 32.0 | 31.1 | 29.9 | 27.2 | 27.2 |
| PREFERE ™ 4536U (50 WT. % NV IN DOWANOL* PMA) | 32.3 | 30.9 | 29.6 | 29.7 | 29.7 |
| DURITE ™ SD-357 (50 WT. % NV IN DOWANOL* PMA) | 1.7 | 1.6 | 1.6 | 1.6 | 1.6 |
| 2-PI (10 WT. % IN DOWANOL* PM) | 1.2 | 1.1 | 1.1 | 1.0 | 1.0 |
| BORIC ACID (20 WT. % NV IN METHANOL) | 1.7 | 1.5 | 1.4 | 1.5 | 1.5 |
| SBM-E40 | 0 | 4.1 | 8.1 | 12.7 | 0 |
| SBM-E41 | 0 | 0 | 0 | 0 | 12.7 |

The varnish formulations in Table 1A are used to make laminates according to the method described above. The data obtained with those laminates is shown in Table 1B below.

TABLE 1B

COMPARATIVE TEST DATA

| TEST | CE-A | Ex. 1 | Ex. 2 | Ex. 3 | Ex. 4 |
| --- | --- | --- | --- | --- | --- |
| VARNISH REACTIVITY (S) | 220 | 247 | 275 | 208 | 250 |

TABLE 1B-continued

COMPARATIVE TEST DATA

| TEST | CE-A | Ex. 1 | Ex. 2 | Ex. 3 | Ex. 4 |
|---|---|---|---|---|---|
| Tg (° C.) | 173 | 175 | 176 | 178 | 174 |
| Td (° C.) | 340 | 339 | 339 | 341 | 340 |
| DRILLABILITY - HALO DIAM. (CM) | 0.89 | 0.81 | 0.75 | 0.77 | NOT MEASURED |
| ENERGY OF DELAMINATION ON IMPACT (J) | 0.496 | 0.587 | 0.631 | 0.677 | 0.724 |
| COPPER PEEL STRENGTH (N/CM) | 13.8 | 15.6 | 15.9 | 18.2 | 16.8 |

As can be seen from the data in Table 1B, copper peel strength of Examples 1 to 4 is substantially improved relative to Comparative Example A while maintaining a similar thermal stability and glass transition temperature. In addition, energy of delamination and halo diameters of Examples 1 to 4 are also improved relative to Comparative Example A.

TABLE 2A

COMPOSITIONS OF EXAMPLE 5 AND COMPARATIVE EXAMPLE B (CE-B)

| RAW MATERIALS | CE-B | Ex. 5 |
|---|---|---|
| D.E.N.* 438 (85 WT. % NV IN MEK) | 5.0 | 4.6 |
| EPILOX ™ B45-03 (70% WT. % NV IN DOWANOL* PMA) | 44.1 | 40.8 |
| SMA 3000 (60 WT. % NV IN MEK) | 58.3 | 53.9 |
| BORIC ACID (20 WT. % NV IN METHANOL) | 0.2 | 0.2 |
| 2-E4MI (20 WT. % NV IN DOWANOL* PM) | 0.1 | 0.1 |
| SBM-E41 | 0 | 7.5 |

The varnish formulations of Table 2A are used to make laminates according to the method described above. Data obtained with those laminates is shown in Table 2B below.

TABLE 2B

COMPARATIVE TEST DATA

| TEST | CE-B | Ex. 5 |
|---|---|---|
| Tg (° C.) | 190 | 193 |
| Td (° C.) | 368 | 363 |
| COPPER PEEL STRENGTH (N/CM) | 8.0 | 10.7 |

As can be seen from the data in Table 2B, copper peel strength of Example 5 is substantially improved relative to Comparative Example B while maintaining a similar thermal stability and glass transition temperature.

Processability

The formulations used for comparative processability testing are described in Table 3A below and the test data obtained with those formulations is shown in Table 3B and FIG. 1.

TABLE 3A

COMPOSITIONS OF EXAMPLE 6 AND COMPARATIVE EXAMPLE C (CE-C)

| RAW MATERIALS | CE-C | Ex. 6 |
|---|---|---|
| D.E.N.* 438 (85 WT. % NV IN DOWANOL* PM) | 36.0 | 34.4 |
| EPILOX ™ B45-03 (70 WT. % NV IN DOWANOL* PMA) | 9.8 | 9.9 |
| PREFERE ™ 4536U (50 WT. % NV IN DOWANOL* PMA) | 30.2 | 28.7 |
| TBBA (60 WT. % NV IN MEK) | 15.6 | 14.9 |
| BORIC ACID (20 WT. % NV IN METHANOL) | 2.9 | 3.0 |
| TPP (100 WT. % NV) | 0.1 | 0.1 |
| 2-PI (20 WT. % NV IN DOWANOL* PM) | 0.5 | 0.4 |
| DOWANOL* PM | 4.9 | 2.8 |
| SBM-E40 | 0 | 5.9 |

The gel time was about 286 s for Comparative Example C and about 253 s for Example 6.

Production of prepreg and laminate:

The varnish described above was used to make laminates for testing in the same manner as for Comparative Example B and Example 5.

The data obtained by applying the above test protocol to the laminates obtained with the formulations in Table 3A is shown in Table 3B below.

TABLE 3B

COMPARATIVE TEST DATA

| TREATER SET-UP | CE-C | | EXAMPLE 6 | |
|---|---|---|---|---|
| NUMBER | GT (S) | MMV (PA · S) | GT (S) | MMV (PA · S) |
| 1 | 104 | 9.6 | 114 | 12.8 |
| 2 | 87 | 14.1 | 100 | 16.6 |
| 3 | 45 | 61.4 | 63 | 69 |
| 4 | — | — | 50 | 107.5 |

The processing window is determined by plotting the minimum prepreg melt viscosity (MMV) as a function of the prepreg gel time (GT). A plot of this data is shown in FIG. 1.

It is usually observed that the flow is optimal when prepreg MMV is between 50 and 150 Pa·s for a prepreg GT of 60 seconds. The incorporation of the SBM toughening agent in Example 6 increased the prepreg MMV for a given GT by about a factor 2 when compared to Comparative Example C. Flow of Example 6 was optimally controlled, while flow was too large in Comparative Example C because of too low MMV. Consequently the laminate thickness was better controlled for Example 6 relative to Comparative Example C.

The compositions according to this invention are useful for coating metal substrates and for making composite materials, laminates, prepregs, and printed wiring boards. They are particularly useful for making prepregs for use in making electrical laminates and printed wiring boards.

What is claimed is:

1. A thermosettable composition having improved adhesion to metal substrates when cured comprising:
   (a) at least one curable flame retardant epoxy resin comprising a diglycidyl ether of tetrabromobisphenol A and/or a phosphorus-containing epoxy resin;
   (b) at least one hardener, each hardener having less than 1 primary amine group per molecule and not more than 1 secondary amine group per molecule, the hardener comprising
      i) at least one polyhydroxy hydrocarbon and/or a hydrocarbon compound capable of generating multiple hydroxy groups per molecule during curing of the thermosettable material, and ii) a poly(acid anhydride) hydrocarbon selected from the group consisting of a copolymer of an ethylenically unsaturated anhydride and an elastomer, a maleic anhydride adduct of methylcyclopentadiene, and combinations thereof; and (c) at least one triblock copolymer comprising at least one elastomeric block and at least one acrylic block;

wherein the composition provides a prepreg formulation having a prepreg minimum melt viscosity of at least 20 Pa·s at a prepreg gel time of 60 seconds; and wherein the composition provides a formulation having a copper peel strength of at least 10 N/cm when cured; and wherein, during curing of the thermosetting material, the weight ratio of the total amount of the poly(acid anhydride) hydrocarbon to the polyhydroxy hydrocarbon and/or the compound capable of generating multiple hydroxyl groups per molecule is not greater than 1:3.

2. The composition according to claim 1, wherein the elastomeric block of triblock copolymer (c) comprises polybutadiene.

3. The composition according to claim 1, wherein the acrylic block of triblock copolymer (c) comprises poly(methyl methacrylate).

4. The composition according to claim 1, wherein the triblock copolymer
(c) further comprises at least one aromatic hydrocarbon block.

5. The composition according to claim 4, wherein the aromatic hydrocarbon block of triblock copolymer (c) comprises polystyrene.

6. The composition according to claim 1, wherein the polyhydroxy hydrocarbon of hardener (b) comprises at least one polyphenol.

7. The composition according to claim 1, wherein the compound capable of generating multiple hydroxy groups per molecule during curing of the thermosettable material of (b) comprises at least one benzoxazine.

8. The composition according to claim 1 further comprising an imidazole catalyst and boric acid.

9. The composition according to claim 1, wherein the composition contains not more than 0.5 wt. % primary amine groups.

10. The composition according to claim 1, wherein the composition contains not more than 1 wt. % secondary amine groups.

11. A process for making a coated article comprising coating an article with at least one composition according to any one of the preceding claims and heating the coated article to cure the coating.

12. A process for making a fiber-reinforced composite article comprising impregnating a fabric with at least one composition according to claim 1 and heating the impregnated fabric to form a fiber-reinforced composite article.

13. The process according to claim 12, wherein the fabric is a woven fabric and the fiber-reinforced composite article is a prepreg.

14. A process for making a laminate comprising (1) pressing a stack comprising at least one electron-conductive metallic substrate and at least one prepreg according to claim 13 disposed on at least one surface of the substrate and (2) heating the stack to cure the prepreg to form the laminate.

15. The process according to claim 14, wherein the laminate is a printed wiring board.

16. An article made according to 12.

17. An article made according to claim 14.

* * * * *